US007876909B2

(12) United States Patent

Neoran et al.

(10) Patent No.: US 7,876,909 B2
(45) Date of Patent: Jan. 25, 2011

(54) EFFICIENT FILTER FOR ARTIFICIAL AMBIENCE

(75) Inventors: Itai Neoran, Beit-Hannanya (IL); Meir Shashoua, Tel Aviv (IL); Yoad Nevo, Tel Aviv (IL)

(73) Assignee: Waves Audio Ltd., Tel-Aviv (IL)

( * ) Notice: Subject to any disclaimer, the term of this patent is extended or adjusted under 35 U.S.C. 154(b) by 1503 days.

(21) Appl. No.: 11/179,510

(22) Filed: Jul. 13, 2005

(65) Prior Publication Data

US 2006/0018486 A1 Jan. 26, 2006

Related U.S. Application Data

(60) Provisional application No. 60/587,047, filed on Jul. 13, 2004.

(51) Int. Cl.
*H03G 3/00* (2006.01)
*H04B 3/20* (2006.01)

(52) U.S. Cl. .............................. 381/63; 381/61; 381/66

(58) Field of Classification Search ............. 381/61–63, 381/66, 118, 119
See application file for complete search history.

(56) References Cited

U.S. PATENT DOCUMENTS 4,584,700 A * 4/1986 Scholz ........................ 381/61
6,215,408 B1 * 4/2001 Leonard et al. ............. 340/644

FOREIGN PATENT DOCUMENTS

SE 0202159-0 * 7/2002 .................. 381/22

OTHER PUBLICATIONS

Niimi K., et al "A new digital reverberation with excellent control capability of early reflections" Audio Engineering Society 74$^{th}$ Convention, (1983) pp. 1-24.
Jot J.M. et al "Digital delay networks for designing artificial reverberators" Audio Engineering Society 90$^{th}$ Convention, (1991) pp. 1-16.
Blaubert J., "Spatial hearing" MIT press (1997) pp. 276-279, 348-358.
Begault D.R., "3-D sound for virtual reality and multimedia" AP professional (1994), pp. 45-46, 99-111, 175-190.
M. Karjalainen et al "More about this reverberation science" Audio Engineering Society 111$^{th}$ Convention, (2001) pp. 1-8.

(Continued)

*Primary Examiner*—Vivian Chin
*Assistant Examiner*—George Monikang
(74) *Attorney, Agent, or Firm*—Browdy and Neimark, P.L.L.C.

(57) ABSTRACT

A circuit, method, and system for producing artificial ambience effect for an input audio signal, mono, stereo, or surround. The ambience effect enhances artificial reverberation, replaces artificial reverberation, or synthesizes extra audio channels, such as surround channels. The circuit may include a transient reduction module and a reverberation filter. The transient reduction module may be adapted to reduce transients in an input audio signal of one or more channels. The reverberation filter maybe adapted to receive a transient-reduced signal of one or more channels corresponding to the transient-reduced signal.

9 Claims, 9 Drawing Sheets

OTHER PUBLICATIONS

Y. Grenier et al "Extraction of weak background transients from audio signals" Audio Engineering Society 114$^{th}$ Convention, (2003) pp. 1-10.

S. Molla et al "Determining local transients of audio signal, white paper by LATP" CMI, Marseille, France (2004) pp. 1-4.

Gardner M.B. "Historical background of the Haas and or precedence effect" J. of Acoustical Society of America, No. 43 (1968) pp. 1243-1247.

D. Griesinger "Practical processors and programs for digital reverberation" Audio Engineering Society 7$^{th}$ Convention, (1989) pp. 187-195.

* cited by examiner

EFFICIENT FILTER FOR ARTIFICIAL AMBIENCE

FIELD OF THE INVENTION

The present invention relates to producing an artificial ambience effect for an input audio signal, mono, stereo, or surround. The ambience effect is intended for example to enhance artificial reverberation, to replace artificial reverberation, or to synthesize extra audio channels, for example surround channels.

BACKGROUND OF THE INVENTION

Provided below is a list of conventional terms. For each of the terms below a short definition is provided in accordance with each of the term's conventional meaning in the art. The terms provided below are known in the art and the following definitions are provided for convenience purposes. Accordingly, unless stated otherwise, the definitions below shall not be binding and the following terms should be construed in accordance with their usual and acceptable meaning in the art.

Reverberation (filter)—A linear or non-linear filter adapted to create a simulation of acoustic behavior within a (certain) surrounding space, typically, but not necessarily, including simulation of reflections from walls and objects. Some kinds of reverberation filters may implement convolution of the input signal or preprocessed derivative of the input signal with pre-recorded impulse-response.

Reflections—The sequence of arrivals to the listener of a pressure impulse emitted in an acoustic space, bouncing back from walls and objects in the space. In artificial reverberation filters - reflections are continuous segments of non-zero filter taps, each segment simulating the impulse response of a reflected replica of the sound.

Transient—Rapid changes in a signal's properties such as intensity, frequency content, or statistical measures.

Transient detection—For a set of time points t=T1 . . . Tn in an input signal S(t) a transient detection is an estimation function T(t) of the amount of transient for every time t=T1 . . . Tn.

Transient reduction—Suppression of transients in a signal using a non-linear process.

RELATED ART

[1] Niimi K., Fujino T., Shimizu Y., A new digital reverberation with excellent control capability of early reflections. Audio Engineering Society 74$^{th}$ Convention, 1983.

[2] Jot J. M., Chaigne A., Digital delay networks for designing artificial reverberators, Audio Engineering Society 90$^{th}$ convention, 1991.

[3] Blaubert J., Spatial hearing, MIT press 1997, pp 276-279, 348-358.

[4] Begault D. R., 3-D sound for virtual reality and multimedia, AP professional 1994, pp 45-46, 99-111, 175-190.

[5] M. Karjalainen & H. Jarvelainen, More about this reverberation science, Audio Engineering Society 111$^{th}$ convention, 2001

[6] Y. Grenier & B. David, Extraction of weak background transients from audio signals, Audio Engineering Society 114$^{th}$ convention, 2003

[7] S. Molla & B. Torresani, Determining local transients of audio signal, white paper by LATP, CMI, Marseille, France, 2004

[8] Gardner M. B, Historical background of the Haas and or precedence effect, J. of Acoustical Society of America, No. 43, 1968.

[9] D. Griesinger—Practical processors and programs for digital reverberation, Engineering Society 7$^{th}$ conference, 1989.

Artificial reverberation is a popular method for enhancing audio production and reproduction in mono, stereo, and surround sound. This process attempts to simulate an acoustic space surrounding the sound-source. This is done by applying a synthetic reverberation filter (linear or non-linear) to the audio signal, giving rise to a reverbed signal simulating reflections arriving from walls or objects in an imaginary room.

In real room acoustics, suppose a pressure impulse is emitted from a sound source and reaches a point where the sound is collected or heard. This direct sound arrival is subject to a time delay, attenuation, and filter, relating to the relative positions of the source and listener. The original pressure impulse is also reflected from walls and objects in the room, and then arrives to the listener point with additional time delay, attenuation, and filtering. The secondary arrivals are called "reflections", and can be seen as discrete peaks in the impulse response of the overall acoustic filter. The order of a reflection is defined as the number of times it hits a wall or object before arriving to a defined destination (e.g., a listener). After a certain time in the impulse response, and beyond a certain order of reflection, the density of the reflections and their overlap increases so much that they are no longer perceived as separate and can only be referred to through their statistical properties and frequency content [3, 4].

In a common artificial reverberation filter the synthetic reflections are implemented as continuous segments of one or more non-zero FIR filter taps [1, 4], and/or IIR filters [2, 4], or a combination, in both cases with slowly decaying impulse responses. A human's perception of space is guided by the relative delays between the direct sound and the reflections, and, in the case of a stereo signal, by the difference and correlation between the left channel reflections and the right channel reflections [3, 9]. Generally, when applying such a reverberation filter to a sound input, and then summing it in some relative level to the input (simulating the direct sound path), the results tend to sound wider and more spacious than the original.

Many attempts have been made to produce artificial reverberations in a manner to create a sense of ambience which is typical of different environments. Unfortunately, in the prior art credible artificial reverberation is considered a very heavy computational task, and in order to produce a credible sense of ambience typical of some environments, considerable amounts of resources are needed. Considering that the impulse response of a typical concert-hall reverberation (for example see FIG. 1) is very long (a few seconds until it decays to an inaudible level), then the number of reflections in it is very large. The quality of the perceived effect of an artificial imitation tightly depends on the number and the density of the simulated reflections. Therefore, in order to achieve a credible sense of ambience typical of a concert hall a large number of non-zero filter taps is required (for a non-limiting simplified example see FIG. 2, showing an impulse-response of a reverberation filter simulating only the major non-zero taps of the natural filter). If the synthetic reflections in a reverberation filter are not dense enough, in time and/or in frequency, an unpleasant comb-filter is perceived [4, 5, 9]. Beyond a certain time gap between the reflections, they are perceived as discrete echoes [4, 9]. The presence of discrete echoes in a concert hall acoustics (for example) is considered bad, as it deteriorates intelligibility and attracts attention away from the instrumental and vocal direct sources. Therefore, prior art synthetic reverberation filter designs commonly use FIR filters having a large number of non-zero filter taps, and/or IIR filters having complex structures, to simulate a high reflections density.

In the same time, the larger the room/hall is, the greater the delay gap between the reflections as can be seen from the following equation [eq. 1, see ref 3]:

$$\text{Number of reflections per second}=4*PI*(C\hat{}3)*(t\hat{}2)/V$$

When c is the speed of sound and V is the room volume. Indeed, discrete echoes would have been heard in concert halls if the hall designers hadn't put much effort in breaking up those echoes into many smaller reflections by using acoustic panels and other objects. Thus, to design a synthetic reverberation filter simulating large hall acoustics, while not increasing the total computational effort, the prior art is many times forced to use more time-delay between non-zero filter taps, causing more time-domain artifacts to be noticeable.

In addition, the early reflections, from the direct (first) arrival up-to approximately 50-80 milliseconds later, contribute less to the perceived spaciousness and more to the sense of distance and localization [2, 9]. Thus, to obtain the effect of a large concert hall and for an increased spaciousness, the reverberation filter designer cannot rely on just the early part of the impulse-response and is usually forced to implement complex filter structures having an impulse response in which peak density increases with time, simulating a continuously increasing reflections density, for example see [5].

On the other hand, "transients" are rapid changes in a signal's properties such as intensity, frequency content, or statistical measures. When the sound source is a short impulse (like hand clapping), the result through the room/hall acoustic filter is a sequence of transients that relate to the individual reflections. The higher the reflections density, the less the transients are perceived, since the reflections merge into one continuous statistical behavior and since in the reverberation filter, the intensity changes between the reflections in the impulse response and the frequency response changes between the reflections are too close in time to be separated by our hearing system which then perceives them as a part of a continuous filter frequency response [4]. By breaking large reflections into many small ones, acoustic designers are able to lower the amount of transient in important parts of the acoustic impulse response.

There exist methods in prior art for detection of transients in audio and for their manipulation. Transient detectors provide an estimation of presence or amount of transient T(t) in a signal S(t) for set of time points t=T1 . . . Tn. Transient detectors for audio can be found for example in [6, 7]. Detecting a transient in an audio signal is essentially a process which includes computing an estimation of the amount of transient present in a signal or a frequency band of a signal. The amount of transient relates to the amount and rapidity of changes in the signals intensity, frequency content, and/or statistical properties, and different transient detectors focus on detecting one or more of the latter properties. When the amount of transient is detected, the information may be used to intensify the transient or to suppress it. This can be done by processing the original signal through a gain, a set of gains, a filter, or in the frequency domain, dynamically controlled by the amount of detected transient. However in the prior art, transient detectors and/or processors have not been used in the context of artificial reverberation, as is described in some embodiments of this present invention.

When considering a reverberation filter, whether natural or artificial, it is possible to separate the part of the filter that contains the reflections from the part that contains the direct sound, and examine them as two separate filters that are summed in the output. One can notice that strong transients can be problematic in the output of the reflections part of reverberation filters, as they allow the listener to perceive individual reflections as echoes. In the same time, transients are not essential at the output of the reflections part of reverberation filters, natural or artificial, for three reasons: Firstly, many reverberation filters contain a direct signal path between the input and the output, representing the acoustic direct path between the source and the listener, and the transients are preserved in this path. Secondly, in many reverberation filters, just as in many real rooms and halls, the reflections part of the filter is very dense with reflections (diffused) and results in smearing in the output of input transients [9]. Thirdly, when a reverberation filter is used to enhance sound that is intended to be reproduced in a direction other than the direction of the source (for example rear surround audio channels where the musical instruments are in the front), then the listener expects to hear less transients in those channels simply since they contain no direct path.

There is thus a need in the art, for a system and method of efficiently producing enhanced artificial reverberations. There is a further need in the art, for a system and a method of efficiently producing enhanced artificial reverberations, requiring a less computationally expensive reverberation filter. There is yet a further need in the art, for a system and a method of efficiently producing enhanced artificial reverberations, wherein reduction of transients is used to reduce the amount of perceived echoes in the output, or to maintain the amount of perceived echoes while lowering the density and/or number of synthetic reflections.

SUMMARY OF THE INVENTION

Some embodiments of the present invention relate to a circuit, a method and a system for producing artificial ambience. In accordance with some embodiments of the present invention, there is provided a circuit for producing artificial ambience. In accordance with some embodiments of the present invention, the circuit may include a transient reduction module and a reverberation filter. In accordance with some embodiments of the present invention, the transient reduction module may be adapted to reduce transients in an input audio signal comprised of one or more channels. In accordance with further embodiments of the present invention the reverberation filter may be adapted to receive the transient-reduced signal comprised of one or more channels and to produce a reverbed signal comprised of one or more channels corresponding to the transient-reduced signal.

In accordance with further embodiments of the present invention, the transient reduction module may be adapted to affect the input audio signal in a manner to decrease the amount of discrete echoes in the reverbed signal. In accordance with yet further embodiments of the present invention, all other things being equal, the transient reduction module may be adapted to affect the input audio signal in a manner to enable the reverberation filter to utilize a substantially smaller number of taps, without substantially increasing the presence of discrete echoes in the reverbed signal.

In accordance with some embodiments of the present invention, circuit may further include a gain and an adder for each reverbed signal channel. In accordance with some embodiments of the present invention, each of said gains may be coupled to a reverbed signal channel and may be adapted to amplify or to attenuate the reverbed signal channel. Each of the one or more adders may be connected to one of the gains and to one of the input signal channels and may be adapted to sum the output of the amplified or attenuated reverbed signal channel to a corresponding input signal channel In accordance with some embodiments of the present invention, the transients reduction module may include a transient detection module, a processing module and one or more gains and/or one or more filters. In accordance with some embodiments of the present invention, the transient detection module may be adapted to detect the presence of transients in an audio signal comprised of one or more channels and to calculate for each detected transient a transient value corresponding to the acoustical properties of the transient. In accordance with some embodiments of the present invention the processing module may be adapted to calculate for each transient value a corresponding gain and/or filter value. In accordance with some embodiments of the present invention, the one or more gains and/or one or more filters may be operatively coupled to the processing module. The one or more gains and/or the one or more filters may be adapted to amplify and/or to attenuate the input audio signal comprised of one or more channels in accordance with a gain and/or filter value received from the processing module.

In accordance with further embodiments of the present invention, the transient reduction module and the reverberation filter may be interchanged, such that the input audio signal may be first applied to the reverberation filter, and the transient reduction module may be fed with the reverbed signal thereby reducing transients in the reverbed signal.

In accordance with some embodiments of the present invention, the transient reduction module may include an absolute value module, an envelope detector module, a maximum value module, a divider module and a smoothing module. In accordance with some embodiments of the present invention, the absolute value module may be adapted to calculate an absolute value signal of a mathematical representation associated with the input audio signal. The envelope detector module adapted to receive the absolute value signal from the absolute value module and to apply a smoothing filter to it, giving rise to an envelope signal. The maximum value module adapted to receive the absolute value from the absolute value module and the envelope signal from said envelope detector module and to determine the maximum of the two signals at each selected time instance. The divider module may be adapted to receive the envelope signal from the envelope detector module and the maximum value signal from the maximum value module and to calculate a ratio between the envelope signal and the maximum value signal at each selected time instance. The smoothing module may be adapted to receive the ratio signal from the divider module and to apply a smoothing filter, giving rise to a smoothed ratio signal. In accordance with some embodiments of the present invention, the smoothed ratio signal may be configured to control a gain applied to the input signal to generate an output signal.

In accordance with further embodiments of the present invention, for each of the one or more channels comprising the input audio signal, the transient reduction module may include an absolute value module and a second maximum value module. In accordance with some embodiments of the present invention the absolute value modules may be adapted to calculate an absolute value of a mathematical representation associated with the audio input channel with which that absolute value module is associated. The second maximum value module may be adapted to determine which of the one or more absolute values calculated by the one or more absolute value modules is the highest. In accordance with further embodiments of the present invention, the envelope detector module may be adapted to receive from the second maximum value module the highest absolute value.

In accordance with further embodiments of the present invention, there is provided a method of producing artificial ambience. In accordance with some embodiments of the present invention, the method may include receiving an input audio signal comprised of one or more audio channels. Once received, transient in the input audio signal may be reduced, giving rise to a transient-reduced signal comprised of one or more channels. The transient-reduced signal may be applied to a reverberation filter, giving rise to a reverbed signal comprised of one or more channels.

BRIEF DESCRIPTION OF THE DRAWINGS

For a better understanding, the invention will now be described by way of example only with reference to the accompanying drawings, in which.

Figure 1:
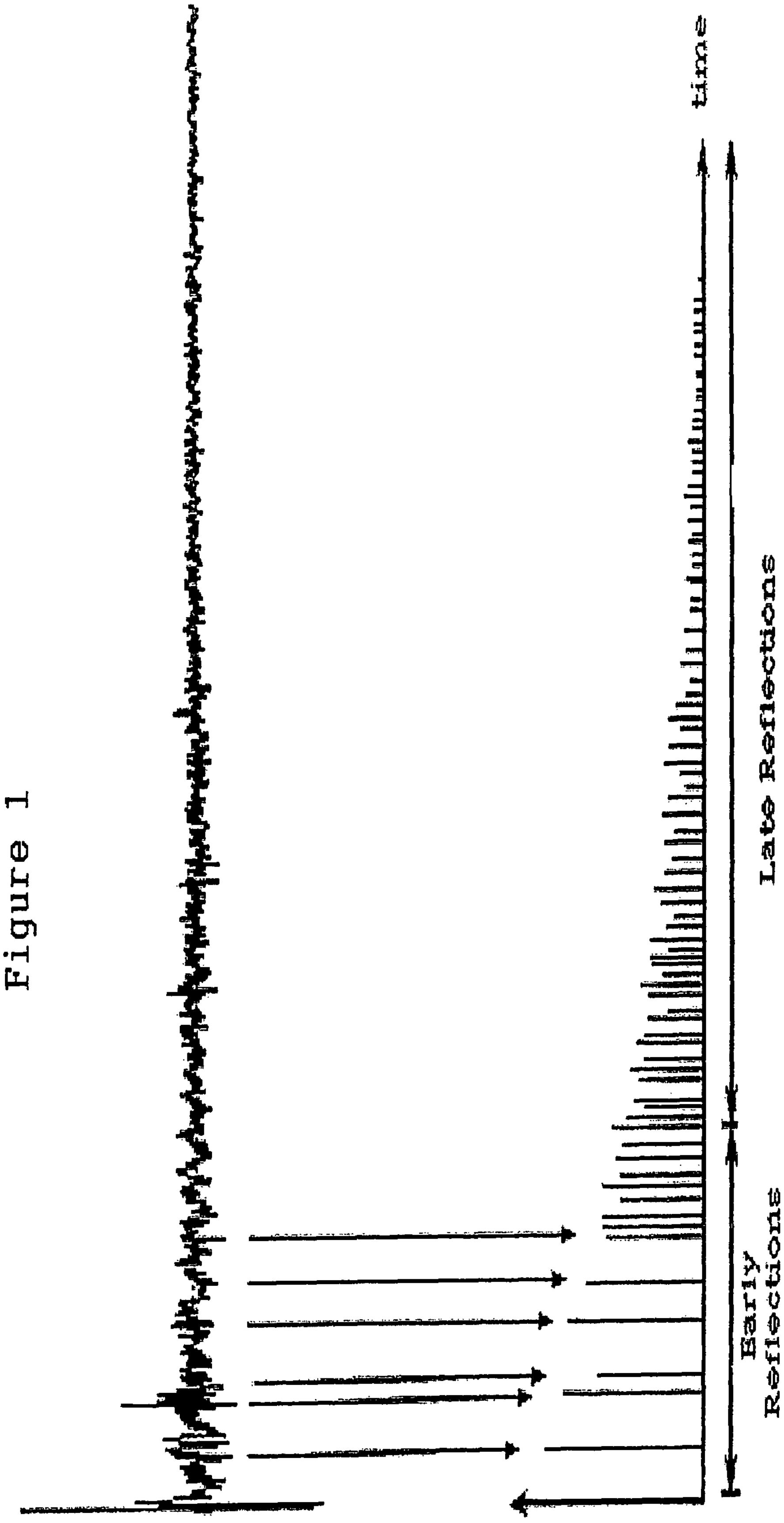
FIG. 1 is a graphical illustration of a natural acoustic impulse response of a typical concert-hall (one channel, only a part of the impulse response)
Figure 2:
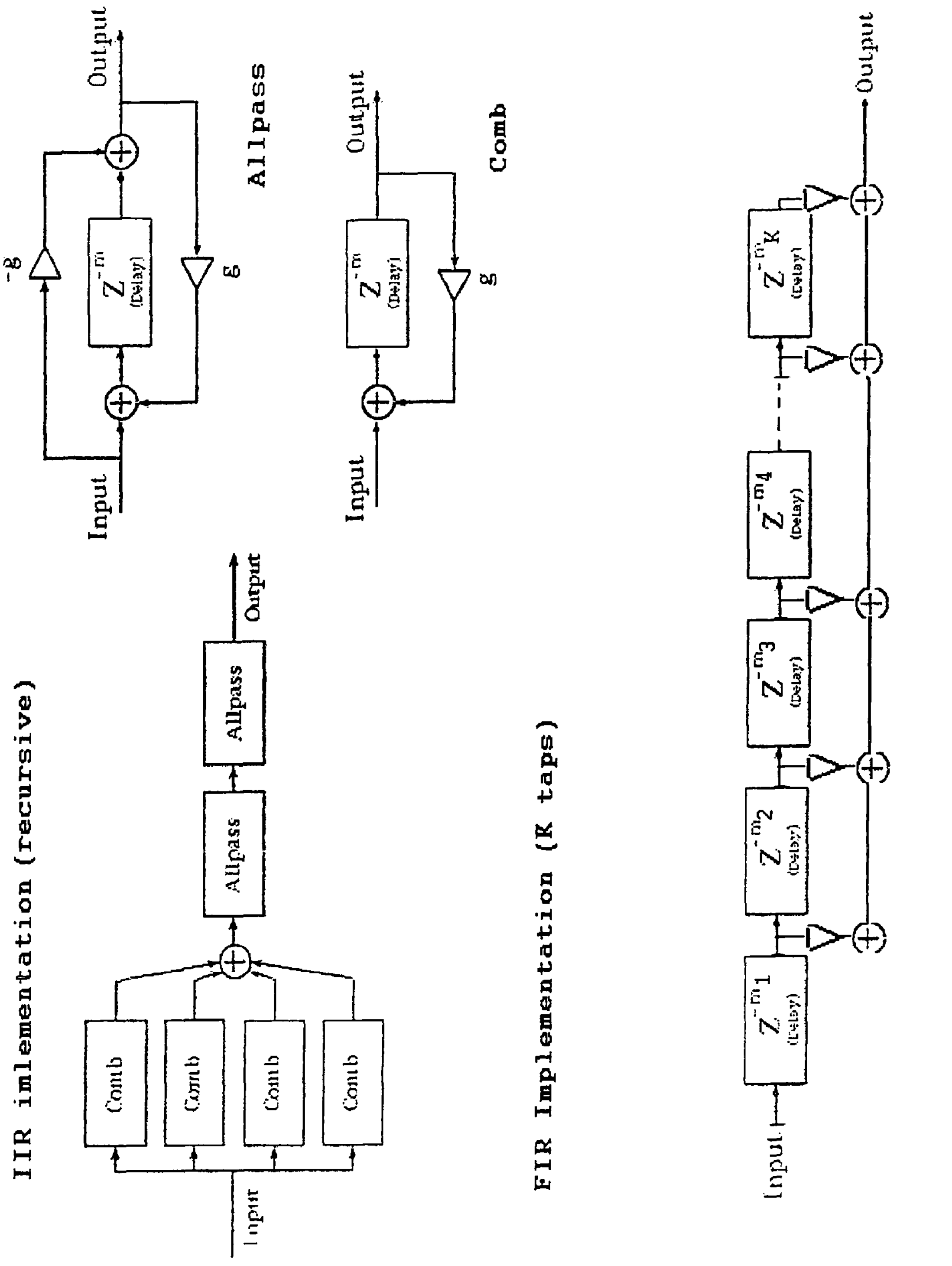
FIG. 2 is a graphical illustration of an exemplary impulse-response of a prior-art synthetic reverberation filter simulating only the major non-zero taps of the natural filter illustrated in FIG. 1.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF SPECIFIC EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some embodiments of the present invention relate to a circuit, a method and a system for producing artificial ambience. In accordance with some embodiments of the present invention, there is provided a circuit for producing artificial ambience. In accordance with some embodiments of the present invention, the circuit may include a transient reduction module and a reverberation filter. In accordance with some embodiments of the present invention, the transient reduction module may be adapted to reduce transients in an input audio signal comprised of one or more channels. In accordance with further embodiments of the present invention the reverberation filter may be adapted to receive the transient-reduced signal comprised of one or more channels and to produce a reverbed signal comprised of one or more channels corresponding to the transient-reduced signal.

In accordance with further embodiments of the present invention, the transient reduction module may be adapted to affect the input audio signal in a manner to decrease the amount of discrete echoes in the reverbed signal. In accordance with yet further embodiments of the present invention, all other things being equal, the transient reduction module may be adapted to affect the input audio signal in a manner to enable the reverberation filter to utilize a substantially smaller number of taps, without substantially increasing the presence of discrete echoes in the reverbed signal.

In accordance with some embodiments of the present invention, circuit may further include a gain and an adder for each reverbed signal channel. In accordance with some embodiments of the present invention, each of said gains may be coupled to a reverbed signal channel and may be adapted to amplify or to attenuate the reverbed signal channel. Each of the one or more adders may be connected to one of the gains and to one of the input signal channels and may be adapted to sum the output of the amplified or attenuated reverbed signal channel to a corresponding input signal channel In accordance with some embodiments of the present invention, the transients reduction module may include a transient detection module, a processing module and one or more gains and/or one or more filters. In accordance with some embodiments of the present invention, the transient detection module may be adapted to detect the presence of transients in an audio signal comprised of one or more channels and to calculate for each detected transient a transient value corresponding to the acoustical properties of the transient. In accordance with some embodiments of the present invention the processing module may be adapted to calculate for each transient value a corresponding gain and/or filter value. In accordance with some embodiments of the present invention, the one or more gains and/or one or more filters may be operatively coupled to the processing module. The one or more gains and/or the one or more filters may be adapted to amplify and/or to attenuate the input audio signal comprised of one or more channels in accordance with a gain and/or filter value received from the processing module.

In accordance with further embodiments of the present invention, the transient reduction module and the reverberation filter may be interchanged, such that the input audio signal may be first applied to the reverberation filter, and the transient reduction module may be fed with the reverbed signal thereby reducing transients in the reverbed signal.

In accordance with some embodiments of the present invention, the transient reduction module may include an absolute value module, an envelope detector module, a maximum value module, a divider module and a smoothing module. In accordance with some embodiments of the present invention, the absolute value module may be adapted to calculate an absolute value signal of a mathematical representation associated with the input audio signal. The envelope detector module adapted to receive the absolute value signal from the absolute value module and to apply a smoothing filter to it, giving rise to an envelope signal. The maximum value module adapted to receive the absolute value from the absolute value module and the envelope signal from said envelope detector module and to determine the maximum of the two signals at each selected time instance. The divider module may be adapted to receive the envelope signal from the envelope detector module and the maximum value signal from the maximum value module and to calculate a ratio between the envelope signal and the maximum value signal at each selected time instance. The smoothing module may be adapted to receive the ratio signal from the divider module and to apply a smoothing filter, giving rise to a smoothed ratio signal. In accordance with some embodiments of the present invention, the smoothed ratio signal may be configured to control a gain applied to the input signal to generate an output signal.

In accordance with further embodiments of the present invention, for each of the one or more channels comprising the input audio signal, the transient reduction module may include an absolute value module and a second maximum value module. In accordance with some embodiments of the present invention the absolute value modules may be adapted to calculate an absolute value of a mathematical representation associated with the audio input channel with which that absolute value module is associated. The second maximum value module may be adapted to determine which of the one or more absolute values calculated by the one or more absolute value modules is the highest. In accordance with further embodiments of the present invention, the envelope detector module may be adapted to receive from the second maximum value module the highest absolute value.

In accordance with further embodiments of the present invention, there is provided a method of producing artificial ambience. In accordance with some embodiments of the present invention, the method may include receiving an input audio signal comprised of one or more audio channels. Once received, transient in the input audio signal may be reduced, giving rise to a transient-reduced signal comprised of one or more channels. The transient-reduced signal may be applied to a reverberation filter, giving rise to a reverbed signal comprised of one or more channels.

In accordance with certain embodiments of the invention a combination of a reverberation filter and a transient reduction process, is used to enhance the overall ambience effect of an input sound signal, mono, stereo, or multi-channel.

Some embodiments of the present invention may be used to reduce the amount and/or density of synthetic reflections, and/or of non-zero filter taps needed for the implementation of an artificial reverberation filter, for example, a reverberation filter as in the prior art. Further embodiments of the present invention may be used in combination with any presently known or yet to be devised in the future artificial reverberation filters. It should be noted that, in some embodiments of the present invention, the use of artificial reverberation filter may contribute to the enhancement of sound quality. The combination of artificial reverberation filter and a transient reduction module may be used as an ambience filter with or without gain and with or without adding the direct sound path (or a simulation of the direct sound, such as the input signal itself). Furthermore, some embodiments of the present invention may be used to generate artificial channels of audio such as surround channels and side channels. It should be noted that the above implementation of some embodiments of the present invention are exemplary in nature, and that the present invention may not be limited to any particular implementation.

Further embodiments of the present invention may be used to enhance an ambience effect in stereo or surround, by lowering the perceived cross-correlation between the channels. One way of lowering the perceived cross-correlation includes introducing a large time delay between the channels. When the delay difference is very large (more than 35 milliseconds), the human sound system is no longer able to perceive directional information from the correlation between the channels [4, 8] and only repeated discrete echoes are heard. Some embodiments of the present invention may be used to eliminate the discrete echoes, a desired effect may be achieved whereby the two or more channels sound as if they are uncorrelated.

The following is a general description of the structure and manner of operation of certain embodiments of the present invention.

Some embodiments of the present invention may include a reverberation filter. In accordance with some embodiments of the present invention, the reverberation filter may be used to generate an acoustic illusion of ambience, generating delayed (and possibly filtered) replicas of the original sound. The present invention may include any presently known or yet to be devised in the future reverberation filter. Exemplary implementations of reverberation filters can be found in the prior art. For convenience purposes replicas of the original sound may sometime be referred to herein as ‘reflections’. The synthetic reflections produced by the reverberation filters are intended to provide an acoustical effect which is similar to reflections from walls in an imaginary room, and in general terms, each reflection is a delayed, attenuated, possibly filtered, replica of the sound source combination of at least one channel of audio.

In accordance with some embodiments of the present invention, transients in the input signal may be detected and may be reduced. In accordance with further embodiments of the present invention, once the transients are reduced, the audio signal may be input to a reverberation filter. Thus, in accordance with some embodiments of the present invention, the reverberation filter(s) may receive the input audio signal following the transients reduction. Those of ordinary skill in the art, may appreciate that transient sound is, typically, not essential, and in many cases not desirable, in the output of reverberation filters for a wide verity of applications. Thus, it may be desirable to reduce transient sound prior to the application of the input audio signal to a reverberation filter. It is thus advantageous to combine the reverberation process and a transient reduction process, as the reduction of transients may prevent artifacts in the reverberation-filtered audio signals. Some aspects of the combination of the reverberation process and a transient reduction process are discussed hereinbelow. The following discussions are provided for convenience purposes and to facilitate a better understanding of the present invention.

Firstly, the combination of the reverberation process and a transient reduction process may prevent the listener from perceiving discrete echoes in the filtered signal. In accordance with some embodiments of the present invention, the discrete echoes may be prevented even if the number of implemented reverberation non-zero filter taps is small and/or the density of synthetic reflections in the impulse-response of the reverberation filter is substantially small. For example, in accordance with some embodiments of the present invention, by applying a transient reduction to the input signal, for instance, a continuous steady-state input signal (such as a sine wave), transients are reduced from the output signal, since when filtering an input having transients with any linear filter (a reverberation filter being a private case), transients may be maintained or reduced (for example any linear filtering of a sine wave is still a sine wave). Thus, the output of a linear reverberation-filter may contain discrete echoes only if the input signal contains transients. Thus, in accordance with some embodiments of the present invention, by eliminating the transients from the input echoes may be eliminated from the output.

Secondly, in accordance with some embodiments of the present invention, transients may be substantially reduced prior to being applied to the reverberation filter. It should be not that even if the transient are only substantially reduced in the input and not completely eliminated, and even if the reverberation filter is not linear, the reduction of level of transients in the output may be sufficient to cause individual echoes to be substantially less perceivable, as can be understood from the perceptual effect known as the HAAS effect [8].

Moreover, in accordance with some embodiments of the present invention, the reverberation filter may include a substantially small number of non-zero taps and/or may have an impulse-response less dense in time. In accordance with further embodiments of the present invention, by reducing transients prior to the application of the sound signal to the reverberation filter, a reverberation filter including only substantially small number of taps and/or other computational resources to achieve an equivalent illusion of ambience with still less risk of unpleasant discrete echoes. Those of ordinary skill in the art may appreciate that by reducing the discrete echoes in the final reverberation effect, a reverberation filter which includes fewer synthetic reflections may be capable of producing reflections which are characterized in that the delay between the reflections substantially large. It would also be appreciated by those of ordinary skill in the art that by reducing the discrete echoes in the final reverberation effect, a reverberation filter which includes fewer synthetic reflections may be capable of reducing the amount of perceived comb-filtering, by providing to the comb-filter's z-transform a high density of zeros (or poles) in the unit circle, see [5]. For example: if the delay between two non-zero FIR taps becomes greater than, say, 50 ms, and between them the impulse response is zero, then the frequency response is a comb-filter with dips (z-transform zeros) every 20 Hz, which is smaller than the bandwidth of the critical band of the human hearing system in most audible range and is thus less noticeable [5].

Having described generally the structure and manner of operation of certain embodiments of the invention, there follows a more detailed description of specific embodiments with reference to the drawings.

Figure 3:
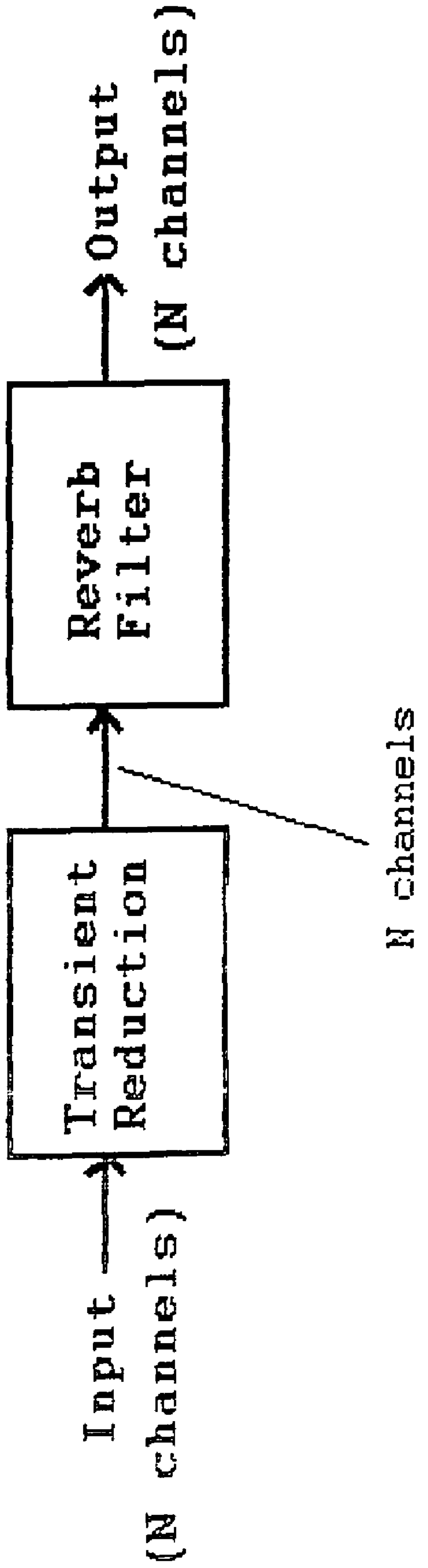
FIG. 3 is a block diagram illustration of a circuit for producing artificial ambience, in accordance with some embodiments of the present invention.

Reference is now made to FIG. 3, which is a block diagram illustration of a circuit for producing artificial ambience, in accordance with some embodiments of the present invention. In accordance with some embodiments of the present invention, a circuit for producing artificial ambience may include a transient reduction module 110 and a reverberation filter 120. In accordance with further embodiments of the present invention, the reverberation filter 120 and the transient reduction module 110 may be combined, for example, as follows: An input audio signal of one or more channels may be fed into the transient reduction module 110, the output signal from the transient reduction module 110 comprised of one or more channels may then fed into the reverberation filter 120. The output signal from the reverberation filter 120 comprised of one or more channels may be fed to the final output.

Figure 4:
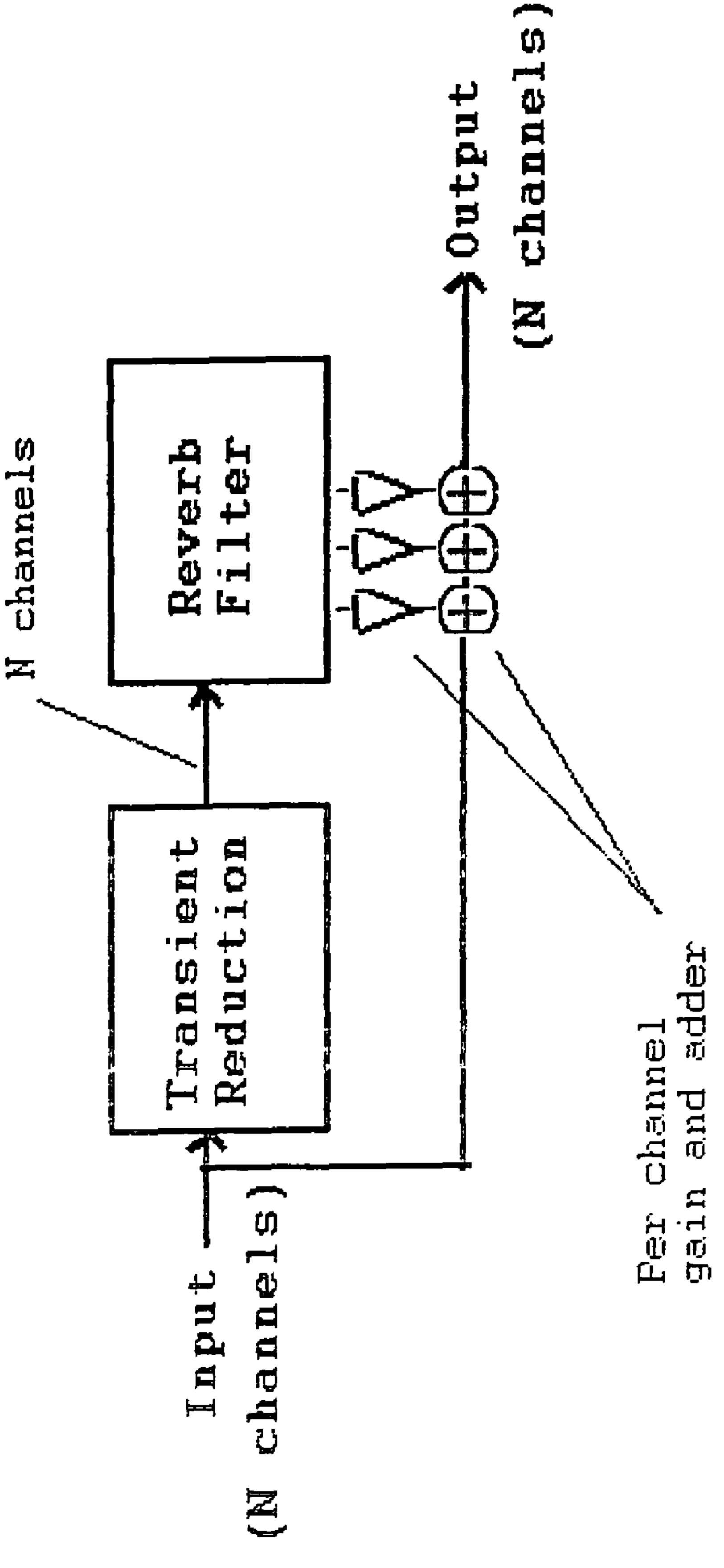
FIG. 4 is a block diagram illustration of a circuit for producing artificial ambience in accordance with further embodiments of the present invention.

Turning now to FIG. 4, there is shown a block diagram illustration of a circuit for producing artificial ambience in accordance with further embodiments of the present invention. In accordance with further embodiments of the present invention, a circuit for producing artificial ambience 200 may include in addition to a reverberation filter 220, a transient reduction module 210, one or more output gains 230 and one or more output adders 240. In accordance with some embodiments of the preset invention, the circuit 200 shown in FIG. 4 may be implemented, for example, as follows: An input audio signal comprised of one or more channels is fed into the transient reduction module 210 and also each channel is fed into a corresponding output adder 240, the output signal from the transient reduction module 210 comprised of one or more channels may then fed into a reverberation filter 220. The output signal from the reverberation filter 220 comprised of one or more channels may be multiplied by a corresponding output gain 230 and then fed into the corresponding output adder. The outputs signals from all output adders may be fed to the final output.

Figure 5:
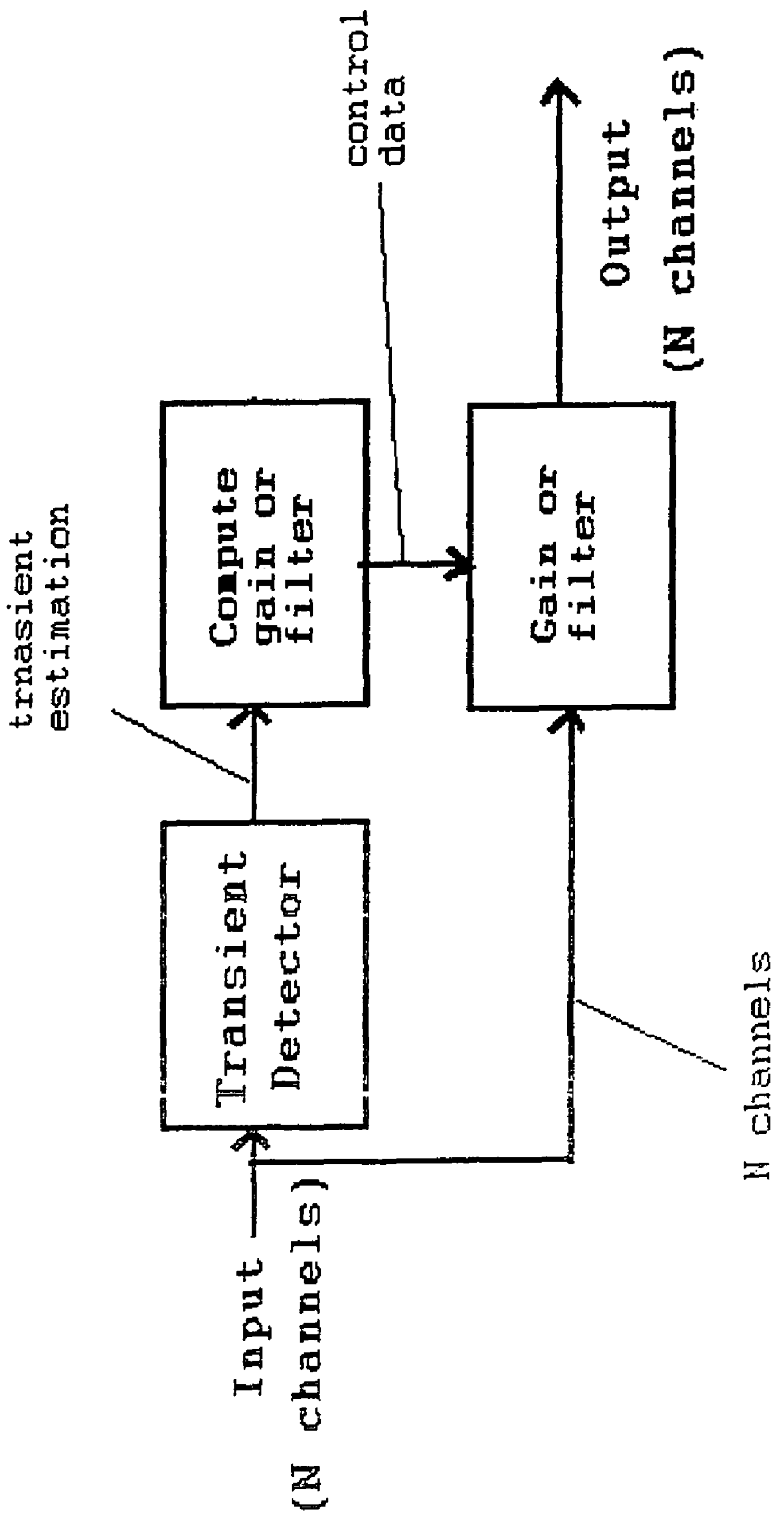
FIG. 5 is a block diagram illustration of one possible implementation of a transient reduction module, in accordance with some embodiments of the present invention.

Reference is now made to FIG. 5, which is a block diagram illustration of one possible implementation of a transient reduction module, in accordance with some embodiments of the present invention. In accordance with some embodiments of the present invention, the transient reduction module 310 may include a transient detection module 312 and a transient processing module 314 and 316. In accordance with some embodiments of the present invention, the input signal, which may be comprised of one or more audio channels, may be fed into the transient detection module 312. The transient detection module 312 may be adapted to analyze the input signal, and may be configured to detect transients in the input signal. As a result of the analysis, the transient detection module 312 may output a transient estimation signal T(t). In accordance with some embodiments of the present invention, the transient estimation module 312 may generate a specific transient estimation value for every time t in the input corresponding to the amount of transient in each input channel.

In accordance with some embodiments of the present invention, the transient processing module 314 may be adapted to receive T(t), at every time t, the transient (estimation) value, and to determine an appropriate gain or filter to each channel in accordance with the transient estimation value (for example via an analytic formula or a look-up table). In accordance with some embodiments of the present invention, the processing module 314 may be adapted to select for each transient estimation value a gain or filter 316, such that the greater the transient estimation value is, the lower the applied gain or the more attenuation is applied to certain frequencies in the input. In accordance with some embodiments of the present invention the transient reduction module may include one or more gain or filters and/or one or more adjustable gain or filters. In accordance with further embodiments of the present invention, the transient reduction module 310 may include suitable gain(s) of filter(s) to provide a variety of amplification and/or attenuation possibilities. In accordance with some embodiments of the present invention, in the case that a filter is used, the filter may be applied in the frequency domain, for example, using Fourier transform. The output of the processing module 316 and the gain or filter may be fed to the output of the transient reduction module 310.

Although some of the transient detection modules and/or some reverberation filter modules which were described above relate to specific kinds of transient detection modules and/or specific kinds of reverberation filter modules, it should be noted that the present invention is not limited in this respect, and that some embodiments of the present invention may be implemented with any presently known or yet to be devised in the future transient detection modules and/or with any presently known or yet to be devised in the future reverberation filter module.

Furthermore, the embodiments of the present invention shown in FIGS. 3-5, and discussed hereinabove with reference to FIGS. 3-5, are exemplary in nature. The present invention is not limited to the configurations and methodology described above, and accordingly some embodiments of the present invention may be include various modifications, additions and/or subtractions. For example, in accordance with one embodiment of the present invention, the artificial ambience circuit may include pre-processing circuitry. The pre-processing circuitry may be applied to the input signal and/or to the input signal of the reverberation filter. By way of another exemplary embodiment, the artificial ambience circuit may include certain post-processing circuitry. The post processing circuitry may be applied to the audio signal before being summed to the output adder. By way of still another non-limiting exemplary embodiment of the present invention, various equalization filters may be inserted anywhere in the processing chain.

By way of still another non-limiting example the order of the reverberation filter and the transient reduction module may be interchanged. It should be noted that a circuit whereby the transient reduction is connected in series to the reverberation filter may not necessarily, but possibly may, produce identical or optimal results but will still have an effect which may be, at least in some aspects, superior in comparison to prior art solution. Those versed in the art will readily appreciate that other modifications may be applied.

Figure 6A:
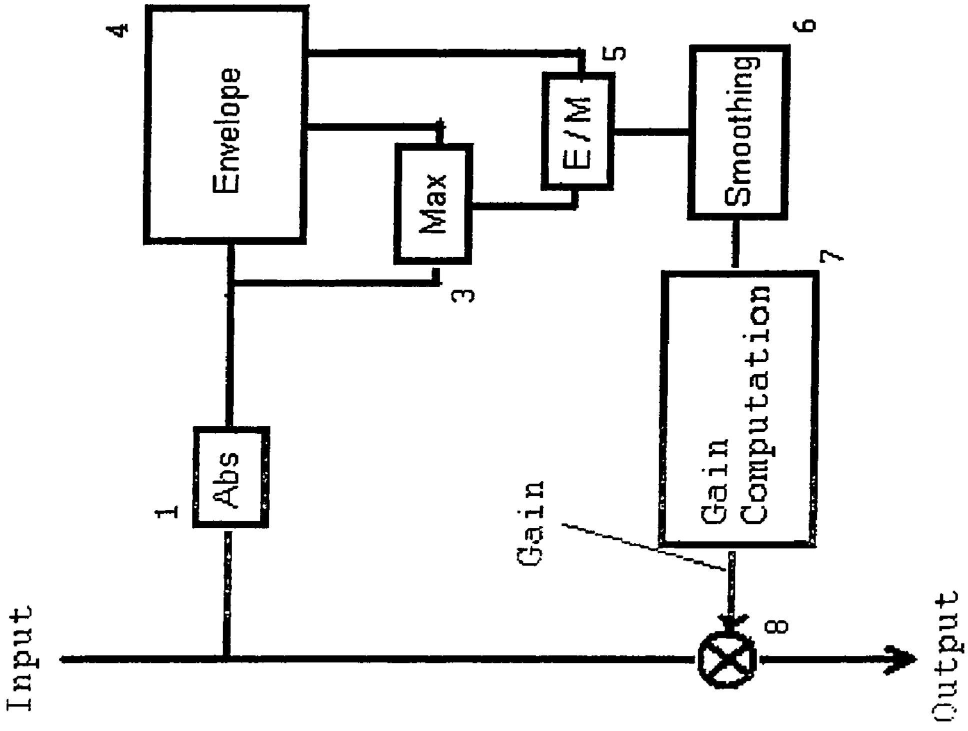
FIG. 6A is a non-limiting possible implementation of a transient reduction module for one or more input channels, in accordance with some embodiments of the present invention.
Figure 6B:
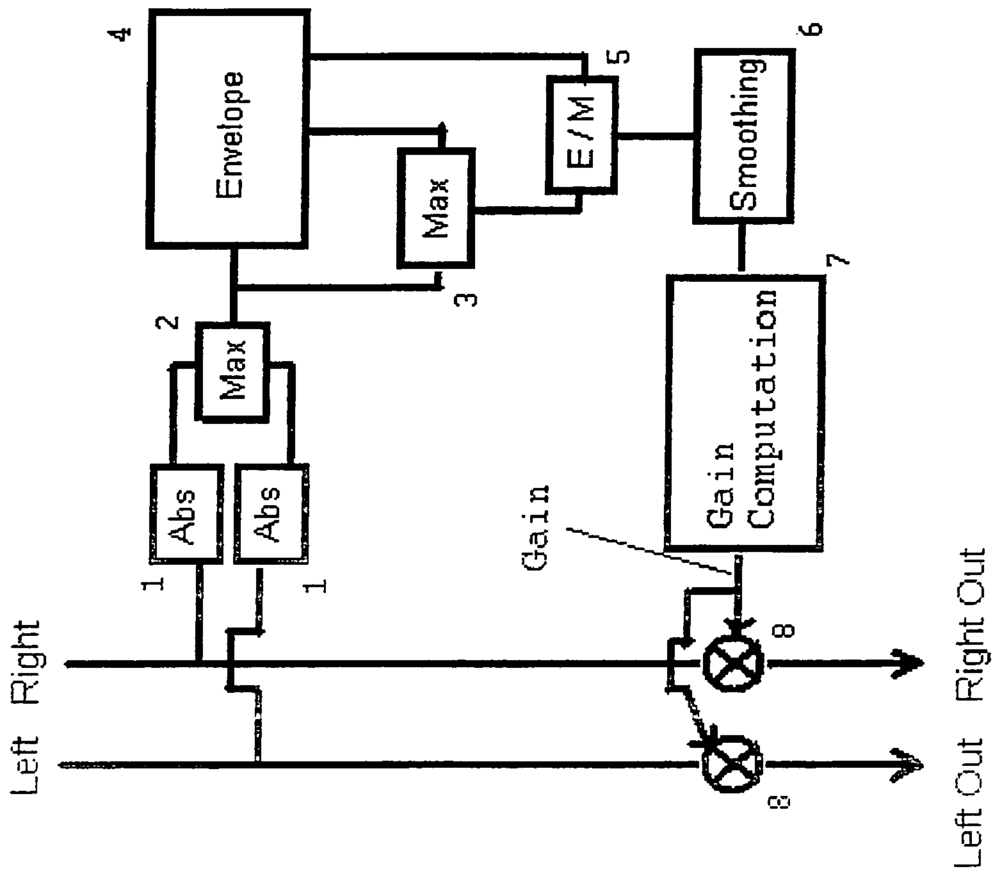
FIG. 6B is a further implementation of a transient reduction module for two or more input channels, in accordance with further embodiments of the present invention.

Turning now to FIG. 6A, there is shown a non-limiting possible implementation of a transient reduction module for one or more input channels, in accordance with some embodiments of the present invention. Additionally, reference is made to FIG. 6B showing a further implementation of a transient reduction module for two or more input channels, in accordance with further embodiments of the present invention. In the embodiment of the present invention shown in FIG. 6A, for the case of one channel input, the transient reduction module may include an input terminal 402 for receiving an input channel of an audio signal, an output terminal 404 for outputting one channel of audio signal, one absolute value module 412, a maximum value module 414, an envelope detector module 415, a divider module 416, a smoothing module 417, gain computation module 418, and one output gain 419. In accordance with some embodiments of the present invention, an input audio signal may be fed into the absolute value module 412 (computing the absolute value of each input signed signal), and the output of the absolute value module 412 may be fed into the maximum value module 414 (computing the maximum value between its two elements) and into the envelope detector module 415 (applying a first smoothing filter on the signal, for example a low-pass filter), in parallel. The output of the envelope detector module 415 may (too) be fed into the maximum value module 414 and also fed into the nominator of the divider module 416. The output of the maximum value module 414 may be fed into the denominator of said divider module 416 the divider computes the ratio between the nominator and the denominator. The output of the divider module 416, which corresponds to the division of the output of the envelope detector module 415 by the output of the maximum value module 414, may be fed into the smoothing module 417 (applying a second smoothing filter to the output of 414, for example a low-pass filter), and the output of the smoothing module 417 may be fed into the gain computation module 418. The gain computation module 418 may calculate, via a fixed formula or look-up table (one possible example being a 'null' gain computation is an identity function, another example is an addition of a constant value so that it limits the minimum gain) a gain factor, as described above and may instruct the gain 419 to amplify the output of the smoothing module 417, accordingly. The amplified signal is thus multiplied with the input audio signal and then fed into the output.

In FIG. 6B, there is shown, a block diagram illustration of transient reduction module of an artificial ambience circuit in accordance with some embodiments of the present invention, suitable for processing an audio signal comprised of a plurality of channels (here two channels are shown but the present invention is not limited in this respect). A transient reduction module 510 suitable for processing an audio signal comprised of a plurality of channels in accordance with some embodiments of the present invention may include: an input terminal 502 for receiving an audio signal including multiple channels, an output terminal 504 for outputting an audio signal including multiple channels, multiple (one per-channel) absolute value modules 512, a first and a second maximum value modules 513 and 514, respectively, an envelope detector module 515, a divider module 516, a smoothing module 517, gain computation module 518, and multiple (one per-channel) output gains 519. In accordance with some embodiments of the present invention, each channel of an input audio signal including multiple channels may be fed into one of the absolute value modules 512, and the output of each of the absolute value modules 512 may be fed into the first maximum value module 513. The first maximum module 513 may be adapted to select the maximum value between the two or more audio channels. The first maximum module 513 may feed the selected maximum value signal into the second maximum value module 514, and in parallel, feed the selected maximum value signal into the envelope detector module 515, as well. The envelope detector module applies a first smoothing filter to the maximum value signal. The output of the envelope detector module 515 may be fed into the second maximum value module 514 and also fed into the nominator of the divider module 516, and the output of the second maximum value module 514 is fed into the denominator of the divider module 516. The divider module 516 may compute the ratio between the nominator to the denominator, and the output of the divider module 516 may be fed into the smoothing module 517. The smoothing module 517 may apply a second smoothing filter to the ratio signal, and the output of the smoothing module 517 may be fed into the gain computation module 518. The output of the gain computation module 518 may multiplied using gains 519 by each of the input audio channels and then fed into the output.

In accordance with another embodiment of the present invention, similar transient reduction modules may be used for processing more than two input channels.

In accordance with one possible non-limiting embodiment of the present invention, the envelope detector may include at least a low-pass filter. In accordance with a further non-limiting embodiment of the present invention, the smoothing module may include at least a low-pass filter. In accordance with yet a further embodiment of the present invention, the gain computation module may include at least a table, a mapping or a mathematical function which are configured to provide, for every possible value received at the gain computation module, a gain value ranging between 0 and 1. It should be noted that any suitable table, mapping, or mathematical function may be used. Thus, in accordance with a possible non-limiting embodiment of the present invention, the gain computation module may include, for example, at least a lookup table configured to provide a gain value for every input value. A simple valid non-limiting example for devising such a look-up table is a one-to-one mapping hence table[I]=I. Another possible mapping can be table[I]=a*I+b, where 'a' and 'b' are constants.

It should be noted that in FIGS. 6A and 6B, the absolute value, maximum value, smoothing, and divider modules correspond to the processing module 314 which is included in the transient reduction module 310 shown in FIG. 5. Similarly, the gain computation module with the output gain(s) shown in FIGS. 6A and 6B correspond to the processing module 316 in figure FIG. 5.

Note also that the transient detector which is illustrated as part of the exemplary embodiment of the present invention shown in FIGS. 6A and 6B does not intend to detect all the different kinds of transients as defined in the terms and definitions of this invention, but some sub-set of what is included in the term as it was defined. More specifically, the transient detector illustrated in FIGS. 6A and 6B may be suitable for detecting only transients which manifest change in signal intensity. It should be noted, that the present invention is not limited to the detection and/or to the reduction of any specific kind of transients, rather some embodiments of the present invention may be used to detect and/or to reduce any kind of transients and may include any necessary presently known components and combination of components know in the present or yet to be devised in the future which are suitable for detect and/or for reducing transients in an audio signal. The reduction of only a sub-set of the transients from an audio signal to be fed into a reverberation filter may be sufficient to, in some cases, to facilitate a significant reduction in the perceived echoes in the output of the reverberation filter.

Figure 7:
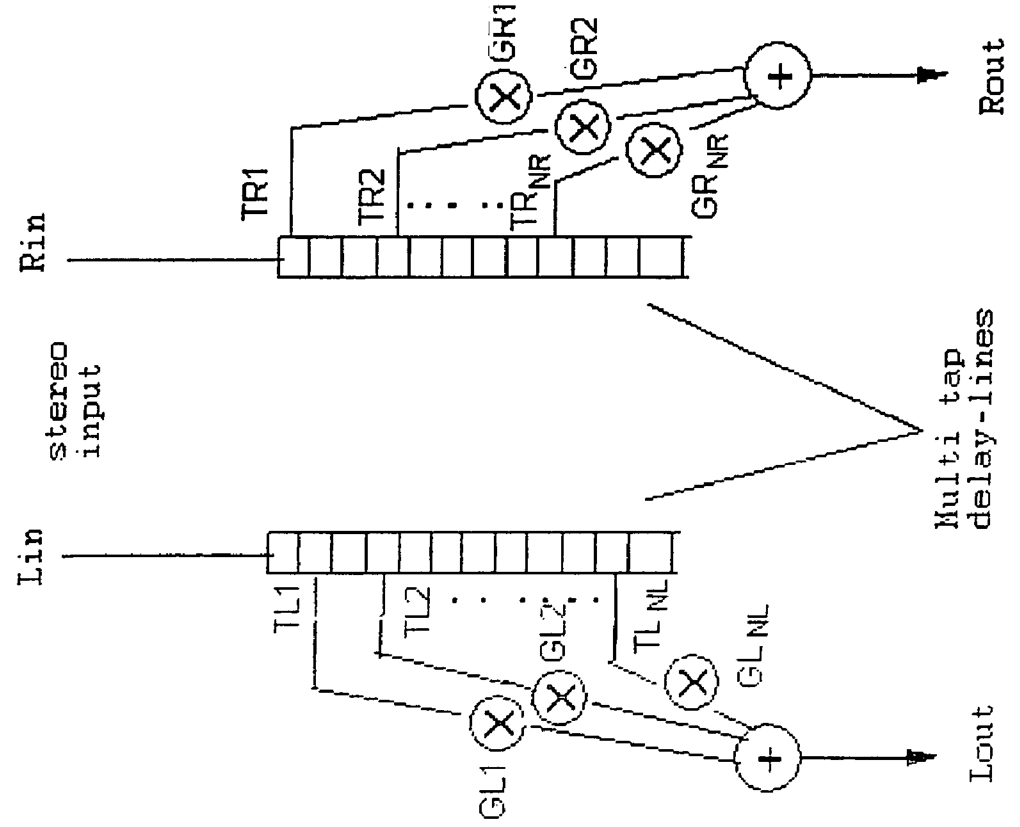
FIG. 7 is a block diagram illustration of an exemplary reverberation filter, in accordance with further embodiments of the present invention.

In accordance with some embodiments of the present invention, the circuit for producing artificial ambience may include, for example, a stereo-to stereo reverberation filter. Reference is now made to FIG. 7, which is a block diagram illustration of an exemplary reverberation filter in accordance with further embodiments of the present invention. In accordance with some embodiments of the present invention, a non-limiting possible implementation of the reverberation filter may be a stereo-to-stereo filter 710 as is shown in FIG. 7. The stereo-to-stereo reverberation filter may be implemented as follows: the input signal Lin is fed into a left delay-line of M audio samples 711. The left delay-line 711 may be read at NL different delay taps TLi for a left channel 712, NL<M. The input signal Rin may be fed into a right delay-line of M audio samples 713. The right delay-line 713 may be read at NR different delay taps TRj for a right channel, NR<M 714, where NL may or may not be set equal to NR. At each tap i<NL, the value read at tap TLi is attenuated by a gain GLi and fed into a left adder 715. At each tap j<NR, the value read at tap TRj may be attenuate by a gain GRj and may be fed into a right adder 716. The output of the left adder 715 is fed to the left channel output of the reverberation filter, and the output of the right adder 716 is fed to the right channel output of the reverberation filter.

Figure 8:
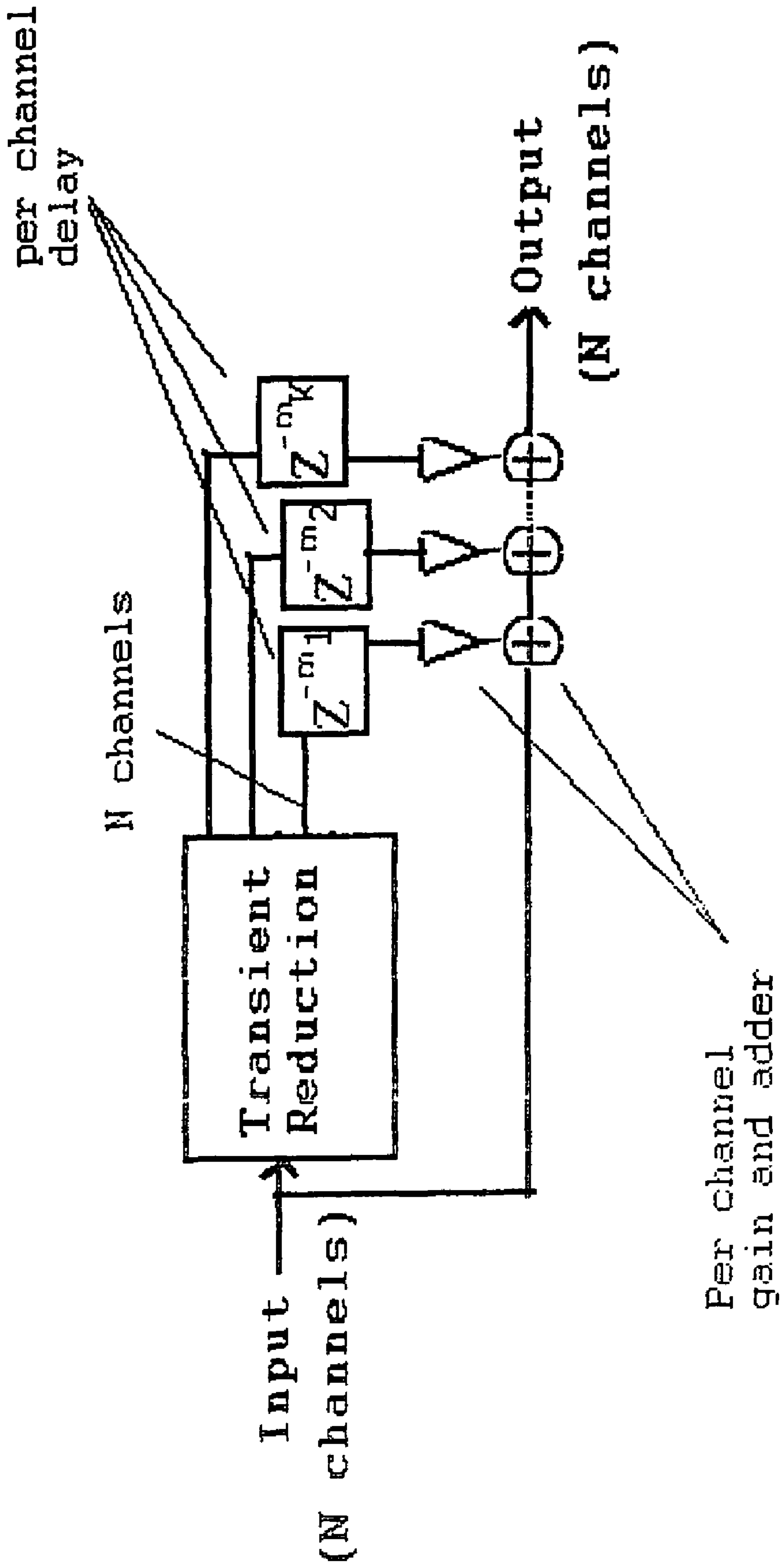
FIG. 8 is a block diagram illustration of an exemplary artificial ambience filter, in accordance with further embodiments of the present invention.

It should be noted that for the embodiment of the circuit for producing artificial ambience shown in FIG. 4, and in accordance with the possible implementation of the reverberation filter discussed in the preceding paragraph, the reduction of transients may allow the reverberation filter to require substantially less non-zero taps, hence a smaller NL and a smaller NR in the example reverberation filter of FIG. 7. Thus, thus in accordance with some embodiments of the present invention, it may be possible, in some cases, to reduce the numbers NL and NR to 1, where TL1 and TR1 are large and where the direct signal is provided (at delay 0) through the direct feed of the input channels to the output adders, as is shown, for example, in the exemplary reverberation filter illustrated by FIG. 8, which may be used as part of a circuit for producing artificial ambience, in accordance with some embodiments of the present invention. In FIG. 8, which is a block diagram illustration of a circuit for producing artificial ambience, in accordance with some embodiments of the present invention. In accordance with some embodiments of the present invention, a circuit for producing artificial ambience may include a transient reduction module 820 and a reverberation filter comprising of a combination of per-channel delays 830, per-channel gains 840, and per-channel adders 850. In accordance with further embodiments of the present invention, the reverberation filter 830,840,850 and the transient reduction module 820 may be combined, for example, as follows: An input audio signal of one or more channels may be fed into the transient reduction module 820, as well as to the per-channel adders 850, the per-channel output signals from the transient reduction module 820 comprised of one or more channels may then fed into the per-channel delays 830, the output signals from the per-channel delays 830 comprised of one or more channels may then fed into the per-channel gains 840, the output signal from the per-channel 840 comprised of one or more channels may then fed into the per-channel adders 850. The output signal from the -channel adders 850 comprised of one or more channels may be fed to the final output.

In case said reverberation filter is implemented digitally, and if the input and/or output to said reverberation filter are analog signals, then said reverberation filter comprises means for converting analog audio to digital audio at its input, and/or means to convert digital audio to analog audio at its output.

It will also be understood that the system according to some embodiments of the present invention may be a suitably programmed computer hardware. Likewise, some embodiments of the present invention may include a computer program being readable by a computer for executing some embodiments of the present invention. The invention further contemplates a machine-readable memory tangibly embodying a program of instructions executable by the machine for executing the method of the invention.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A circuit for producing artificial ambience, said circuit comprising:

a transient reduction module adapted to reduce transients in an input audio signal comprised of one or more channels, said transient reduction module comprises:

an absolute value module adapted to calculate an absolute value signal of a mathematical representation associated with the input audio signal;

an envelope detector module adapted to receive the absolute value signal from said absolute value module and to apply a smoothing filter to it, giving rise to an envelope signal;

a maximum value module adapted to receive the absolute value signal from said absolute value module and the envelope signal from said envelope detector module and to determine the maximum of the two signals at each selected time instance:

a divider module adapted to receive the envelope signal from said envelope detector module and the maximum value signal from said maximum value module and to calculate a ratio between the envelope signal and the maximum value signal at each selected time instance; and a smoothing module adapted to receive the ratio signal from said divider module and to apply a smoothing filter, giving rise to a smoothed ratio signal, and wherein the smoothed ratio signal is adapted to control a gain applied to the input signal to generate an output signal; and a reverberation filter adapted to receive the transient-reduced signal comprised of one or more channels and to produce a reverbed signal comprised of one or more channels corresponding to the transient-reduced signal.

2. The circuit according to claim 1, wherein said transient reduction module is adapted to affect the input audio signal in a manner to decrease the amount of discrete echoes in the reverbed signal.

3. The circuit according to claim 1, wherein, all other things being equal, said transient reduction module is adapted to affect the input audio signal in a manner to enable said reverberation filter to utilize a substantially smaller number of taps, without substantially increasing the presence of discrete echoes in the reverbed signal.

4. The circuit according to claim 1, further comprising a gain and an adder for each reverbed signal channel, wherein each of said gains is coupled to a reverbed signal channel and is adapted to amplify or to attenuate the reverbed signal channel, and wherein each of said one or more adders is connected to one of said gains and to one of said input signal channels and is adapted to sum the output of the amplified or attenuated reverbed signal channel to a corresponding input signal channel.

5. The circuit according to claim 1, wherein said transients reduction module comprises:

a transient detection module, said transient detection module being adapted to detect the presence of transients in an audio signal comprised of one or more channels and to calculate for each detected transient a transient value corresponding to the acoustical properties of the transient;

a processing module being adapted to calculate for each transient value a corresponding gain and/or filter value; and one or more gains and/or one or more filters operatively coupled to said processing module, wherein said one or more gains and/or said one or more filters are adapted to amplify and/or to attenuate the input audio signal comprised of one or more channels in accordance with a gain and/or filter value received from said processing module.

6. The circuit according to claim 5, wherein said processing module is adapted to calculate for each transient value a corresponding gain and/or filter value expected to substantially reduce the corresponding transient.

7. The circuit according to claim 5, wherein the amplified and/or attenuated input audio signal is fed into said reverberation filter.

8. The circuit according to claim 1, wherein said transient reduction module and said reverberation filter are interchanged, such that the input audio signal is first applied to said reverberation filter, and said transient reduction module is fed with the reverbed signal thereby reducing transients in the reverbed signal.

9. The circuit according to claim 1, wherein for each of the one or more channels comprising the input audio signal, said transient reduction module includes an absolute value module, and wherein each of said absolute value modules is adapted to calculate an absolute value signal of a mathematical representation associated with the audio input channel with which that absolute value module is associated, and wherein said transient reduction module includes a second maximum value module, said second maximum value module being adapted to determine which of the one or more absolute value modules is the highest, and wherein said envelope detector module is adapted to receive from said second maximum value module the highest absolute value signal.

* * * * *